(12) United States Patent
Kim et al.

(10) Patent No.: US 10,921,916 B2
(45) Date of Patent: Feb. 16, 2021

(54) DISPLAY DEVICE

(71) Applicant: Samsung Display Co., Ltd., Yongin-Si (KR)

(72) Inventors: Kyungseop Kim, Hwaseong-si (KR); Kwanho Kim, Yongin-si (KR); Inseo Kee, Asan-si (KR); Sungkyun Park, Hwaseong-si (KR); Hoseok Son, Seoul (KR); Jinbo Shim, Yongin-si (KR); Sangyoun Han, Seoul (KR); Jungmoo Hong, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/274,034

(22) Filed: Feb. 12, 2019

(65) Prior Publication Data
US 2019/0278410 A1  Sep. 12, 2019

(30) Foreign Application Priority Data

Mar. 9, 2018 (KR) .................... 10-2018-0027821

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *H01L 27/323* (2013.01); *G06F 2203/04103* (2013.01); *G06F 2203/04112* (2013.01)

(58) Field of Classification Search
CPC combination set(s) only.
See application file for complete search history.

(56) References Cited

U.S. PATENT DOCUMENTS

| | | | |
|---|---|---|---|
| 9,280,242 B2 | 3/2016 | Choung et al. | |
| 9,841,833 B2 | 12/2017 | Kim et al. | |
| 9,941,485 B2 | 4/2018 | Lee et al. | |
| 2013/0134426 A1* | 5/2013 | Kim | H01L 23/293 257/59 |
| 2016/0204952 A1* | 7/2016 | Du | H04L 12/281 340/12.53 |
| 2017/0192572 A1 | 7/2017 | Han et al. | |
| 2017/0213873 A1 | 7/2017 | Bok et al. | |
| 2019/0204952 A1* | 7/2019 | Han | H01L 27/3246 |

FOREIGN PATENT DOCUMENTS

| | | |
|---|---|---|
| KR | 10-2015-0007062 A | 1/2015 |
| KR | 10-2017-0003388 A | 1/2017 |
| KR | 10-2017-0075876 A | 7/2017 |

(Continued)

*Primary Examiner* — Deeprose Subedi
(74) *Attorney, Agent, or Firm* — Innovation Counsel LLP

(57) ABSTRACT

Disclosed herein is a display device. The display device includes: a display panel including a substrate; and a touch sensing unit located on the substrate. The touch sensing unit includes: a first pattern including a plurality of first lines; a first insulating layer located on the first pattern; and a second pattern located on the first insulating layer, and including a plurality of second lines overlapping the first lines in parallel with each other on a plane. Both side first boundary lines defining a width of each of the first lines are located between both side second boundary lines defining a width of each of the second lines on a plane.

35 Claims, 10 Drawing Sheets

(56) References Cited

FOREIGN PATENT DOCUMENTS

| KR | 10-2017-0080203 A | 7/2017 |
| KR | 10-2017-0080314 A | 7/2017 |
| KR | 10-2017-0081017 A | 7/2017 |
| KR | 10-2017-0089460 A | 8/2017 |
| KR | 10-2017-0112337 A | 10/2017 |

* cited by examiner

DISPLAY DEVICE

CROSS-REFERENCE TO RELATED APPLICATION

This application claims priority under 35 U.S.C. § 119 to Korean Patent Application No. 10-2018-0027821, filed on Mar. 9, 2018, in the Korean Intellectual Property Office (KIPO), the disclosure of which is incorporated by reference herein in its entirety.

1. TECHNICAL FIELD

The present disclosure relates to a display device, and more specifically to a display device which can minimize the reflection of light from a touch sensing unit.

2. DISCUSSION OF RELATED ART

Flat panel displays (FPDs), such as an organic light-emitting diode (OLED) display, a liquid crystal display (LCD), and an electrophoretic display (EPD), each include a display panel on which electric field generating electrodes and an electro-optical active layer are disposed.

Such display devices may have a touch sensing function capable of interacting with a user in addition to a function of displaying an image by means of a display panel. The touch sensing function is configured such that when a user touches a screen with a finger, a touch pen, or the like, the display device senses a change in pressure, charge, light, or the like applied to the screen, thereby becoming aware of touch information about whether or not an object touches the screen and the location of a touch. The display device can receive a video signal based on the touch information.

Such a touch sensing function may be implemented by a touch sensing unit including a plurality of first sensing electrodes and a plurality of second sensing electrodes which intersect each other.

SUMMARY

The present disclosure is directed to a display device which can improve the touch sensitivity of a touch sensing unit and which can minimize the reflection of light from the touch sensing unit.

According to one embodiment, there is provided a display device including: a display panel including a substrate; and a touch sensing unit located on the substrate. The touch sensing unit includes a first pattern including a plurality of first lines, a first insulating layer located on the first pattern, and a second pattern located on the first insulating layer, and including a plurality of second lines overlapping the first lines in parallel with each other on a plane. Both side first boundary lines defining a width of each of the first lines are located between both side second boundary lines defining a width of each of the second lines on the plane.

The touch sensing unit may further include a second insulating layer located on the first insulating layer and the second pattern.

Each of the first boundary lines and a corresponding one of the second boundary lines, which are adjacent to each other, may be parallel to each other.

An interval between each of the first boundary lines and a corresponding one of the second boundary lines, which are adjacent to each other, may be equal to or larger than 0.2 µm.

An interval between each of the first boundary lines and a corresponding one of the second boundary lines, which are adjacent to each other, may be equal to or larger than 0.35 µm.

The first pattern and the second pattern may have the same shape.

The width of the second lines may be larger than the width of the first lines by 0.4 µm or more.

The width of the second lines may be larger than the width of the first lines by 0.7 µm or more.

The display device may include a plurality of pixels on the substrate; and each of the first lines and the second lines may extend along a boundary between the pixels.

Each of the first lines and the second lines may have a mesh shape which surrounds at least one of the pixels.

The first pattern and the second pattern may be metal.

The top surface of the first insulating layer may be flat.

The first insulating layer may include an organic layer.

The second insulating layer may include an organic layer.

An inorganic layer may be on the organic layer.

The display device may further include an encapsulation layer located on the substrate; and the touch sensing unit may be located on the encapsulation layer.

The display device may further include a buffer layer on the encapsulation layer; and the touch sensing unit may be located on the buffer layer.

The first pattern may include: a plurality of first sub-patterns extending in a first direction, and spaced apart from each other in a second direction intersecting the first direction; and a plurality of second sub-patterns separated from the plurality of first sub-patterns. The second pattern may include: a plurality of third sub-patterns extending in the second direction, and spaced apart from each other in the first direction; and a plurality of fourth sub-patterns separated from the plurality of third sub-patterns.

The second sub-patterns may overlap the third sub-patterns, and the first sub-patterns may overlap the fourth sub-patterns.

The second sub-patterns and the third sub-patterns may be coupled to each other and the first sub-patterns and the fourth sub-patterns may be coupled to each other via contact holes defined in the first insulating layer.

According to another embodiment, there is provided a display device including: a display panel including a plurality of pixels; and a touch sensing unit located on the display panel. The touch sensing unit includes: a first pattern including a mesh defining a plurality of first openings; a first insulating layer located on the first pattern; and a second pattern located on the first insulating layer, and including a mesh defining a plurality of second openings which overlap the plurality of first openings. An area of the first openings is larger than an area of the second openings.

The first openings may be located inside the second openings on a plane.

The mesh of the second pattern may overlap the first openings on the plane, and the mesh of the first pattern may not overlap the second openings on the plane.

A boundary line of each of the first openings may be parallel to a boundary line of a correspond one of the second openings.

The boundary line of each of the first openings may not intersect the boundary line of a correspond one of the second openings on a plane.

An interval between the boundary line of each of the first openings and the boundary line of a correspond one of the second openings may be 0.2 µm or more on a plane.

An interval between the boundary line of each of the first openings and the boundary line of a correspond one of the second openings may be 0.35 μm or more on a plane.

The area of the first openings and the area of the second openings may be larger than an area of the pixels.

According to still another embodiment, there is provided a display device including: a display panel including a substrate; and a touch sensing unit located on the substrate. The touch sensing unit includes: a plurality of first detection units extending in a first direction, and arranged in a second direction intersecting the first direction; and a plurality of second detection units extending in the second direction, and arranged in the first direction. Each of the plurality of first detection units and the plurality of second detection units includes: a first pattern including a plurality of first lines; a first insulating layer located on the first pattern; and a second pattern located on the first insulating layer, and including a plurality of second lines overlapping the first lines in parallel with each other on a plane. Both side first boundary lines defining the width of each of the first lines are located between both side second boundary lines defining the width of each of the second lines on the plane.

Each of the first detection units may include: a plurality of first sensing electrodes arranged in the first direction; and a plurality of first connection electrodes connecting the first sensing electrodes which are adjacent to each other; and each of the second detection units may include: a plurality of second sensing electrodes arranged in the second direction; and a plurality of second connection electrodes connecting the second sensing electrodes which are adjacent to each other.

Each of the first sensing electrodes and the second sensing electrodes may include the first pattern and the second pattern.

Any one of the first connection electrodes and the second connection electrodes intersecting the first connection electrodes on the plane may include the first pattern, and another one of the first connection electrodes and the second connection electrodes intersecting the first connection electrodes on the plane may include the second pattern.

The display device may further include pad electrodes located on a pad portion of the substrate; and the touch sensing unit may include a plurality of transmission lines comprising first ends connected to the first detection units and the second detection units, respectively, and second ends connected to the pad electrodes.

Each of the transmission lines may include the first pattern and the second pattern.

The first pattern and second pattern of each of the transmission lines may be connected via a plurality of contact holes defined in the first insulating layer.

BRIEF DESCRIPTION OF THE DRAWINGS

A more complete appreciation of the inventive concept will become more apparent by describing in detail exemplary embodiments thereof with reference to the accompanying drawings, wherein:

FIG. 1b is a sectional view of the display device of FIG. 1a;

FIG. 4 is an enlarged view of portion B of FIG. 3a;

FIG. 5 is a sectional view taken along line I-I' of FIG. 3a;

DETAILED DESCRIPTION

Figure 1A:
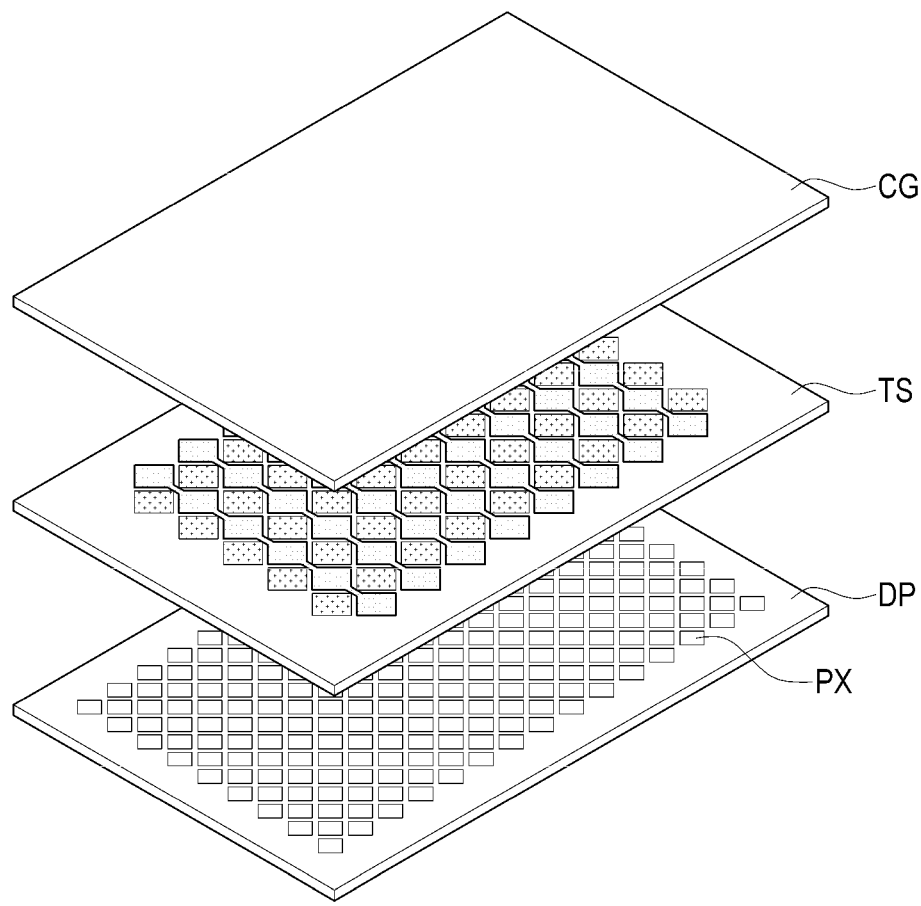
FIG. 1a is an exploded perspective view of a display device according to an exemplary embodiment of the present disclosure.

Features of the inventive concept and methods for achieving them will become apparent from exemplary embodiments described below in detail in conjunction with the accompanying drawings. However, the inventive concept is not limited to the following exemplary embodiments, but may be implemented in various different forms. These exemplary embodiments are provided merely to make the disclosure of the present disclosure complete and to fully convey the scope of the inventive concept to a person having ordinary knowledge in the art to which the inventive concept pertains. The inventive concept is defined only by the scope of the attached claims. Therefore, in some exemplary embodiments, well-known process steps, component structures, and technologies will not be described in detail in order to prevent the present disclosure from being obscurely interpreted. Throughout the specification, the same reference symbols refer to the same components.

Throughout the drawings, thicknesses are illustrated in an exaggerated manner in order to clearly describe a plurality of layers and areas. Like reference numbers are used to denote like elements throughout the specification. When a portion, such as a layer, a film, an area, a plate, or the like, is described to as being "on" another portion, this means not only a case where the former portion is disposed "immediately on" the latter portion but also a case where the former portion is disposed "on" the latter portion with a third portion interposed therebetween. In contrast, when a portion is described to as being "immediately on" another portion, this means a case where a third portion is not present therebetween. Furthermore, when a portion, such as a layer, a film, an area, a plate, or the like, is described to as being "beneath" another portion, this means not only a case where the former portion is disposed "immediately beneath" the latter portion but also a case where the former portion is disposed "beneath" the latter portion with a third portion interposed therebetween. In contrast, when a portion is described to as being "immediately beneath" another portion, this means a case where a third portion is not present therebetween.

Spatially relative terms, such as "below", "beneath", "lower", "above", "upper", and the like, may be used herein for ease of description to describe the relationship between one element or feature and another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Accordingly, the exemplary term "below" can encompass both the orientations of above and below. The device may be also oriented in another direction, and thus the spatially relative terms may be interpreted differently depending on the orientation.

Throughout the present specification, when any portion is described as being connected to another portion, this includes not only a case where they are directly connected to each other but also a case where they are electrically connected to each other with an element interposed therebetween. Furthermore, when any portion is described as including any component, this is not intended to exclude another component but is intended to include another component, unless particularly described to the contrary.

Although the terms "first," "second," "third," etc. may be used herein to describe various components, these components should not be limited by these terms. These terms may be each used merely to distinguish one component from another component. For example, a first component may be termed a second or third element without departing from the teachings of the exemplary embodiments. In a similar manner, a second or third component may be termed interchangeably.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

A display device according to the present disclosure will be described in detail below with reference to FIGS. 1a to 9b.

Figure 1B:
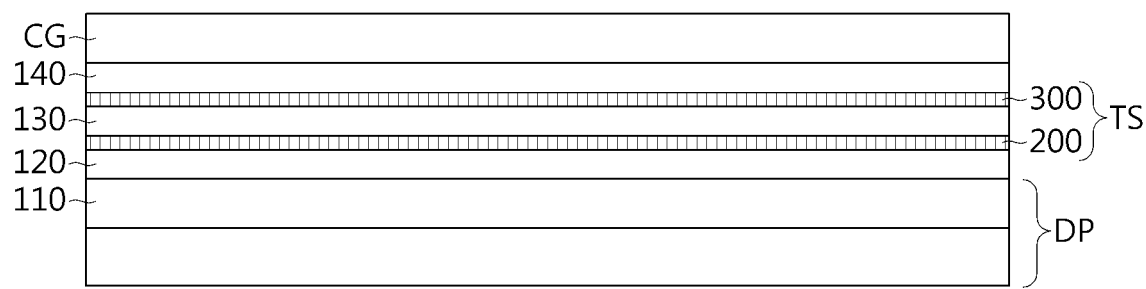

FIG. 1a is an exploded perspective view of a display device according to an exemplary embodiment of the present disclosure. FIG. 1b is a sectional view of the display device of FIG. 1a.

As shown in FIGS. 1a and 1b, the display device according to the present exemplary embodiment includes a display panel DP, a touch sensing unit TS, and a cover glass CG.

The display panel DP may be any one of a liquid crystal display (LCD) panel, an organic light-emitting diode (OLED) display panel, a plasma display panel (PDP), and an electrophoretic display panel.

The display panel DP may include a plurality of pixels PX which are arranged in a matrix form. Although the pixels PX are shown as having a substantially rhombic shape, the shape of the pixels PX is not limited thereto. The pixels PX may have one of various shapes, such as a rectangular shape, a triangular shape, etc.

The pixels PX may include red pixels, green pixels, and blue pixels. As another example, the pixels PX may include red pixels, green pixels, blue pixels, cyan pixels, magenta pixels, yellow pixels, and white pixels. In an exemplary embodiment of the present disclosure, the display panel DP may be an organic light-emitting display panel, and the pixels PX may be defined as light-emitting regions by a pixel defining layer.

The display panel DP may include a display area configured such that the pixels PX are arranged on a substrate (not shown) and display images, and a non-display area disposed along the edges of the display area. Various types of conductive lines configured to drive the pixels PX may be disposed in the non-display area.

The touch sensing unit TS may be located on the display panel DP. For example, when the display panel DP is the above-described organic light-emitting display device, the display panel DP may include a substrate and an encapsulation layer 110 disposed on the substrate. In this case, the touch sensing unit TS may be located on the encapsulation layer 110 of the display panel DP. More specifically, the touch sensing unit TS may be located between the encapsulation layer 110 of the display panel DP and the cover glass CG.

The encapsulation layer 110 may be a transparent insulating substrate including glass and plastic of a transparent material. Furthermore, the encapsulation layer 110 may have a structure in which one or more inorganic films and one or more organic films are alternately stacked on top of one another.

As another exemplary embodiment, the touch sensing unit TS may be located inside the display panel DP, e.g., between the substrate and the encapsulation layer 110.

As described above, the touch sensing unit TS may be located on the display panel DP or inside the display panel DP. In other words, the touch sensing unit TS may be located on the substrate of the display panel DP.

Referring to FIG. 1b, the touch sensing unit TS includes a buffer layer 120 disposed on the encapsulation layer 110, a first pattern 200 disposed on the buffer layer 120, a first insulating layer 130 disposed on the buffer layer 120 and the first pattern 200, a second pattern 300 disposed on the first insulating layer 130, and a second insulating layer 140 disposed on the first insulating layer 130 and the second pattern 300.

The buffer layer 120 is disposed on the encapsulation layer 110, and functions to prevent moisture or impurities from penetrating and to flatten the surface of the encapsulation layer 110. The buffer layer 120 may include an inorganic insulating film or an organic insulating film.

The buffer layer 120 may be deposited on the encapsulation layer 110 by using, for example, $SiO_2$, $SiN_x$, or the like by means of one of various deposition methods, such as a plasma enhanced chemical vapor deposition (PECVD), atmospheric pressure chemical vapor deposition (APCVD), and low pressure chemical vapor deposition (LPCVD). However, the buffer layer 120 is not limited thereto, but may be omitted when necessary.

The first pattern 200 is disposed on the buffer layer 120. The first pattern 200 may include at least one of low-resistance metals, such as titanium (Ti), aluminum (Al), silver (Ag), copper (Cu), chromium (Cr), and nickel (Ni). For example, each first sensing electrode 211 may include three layers, e.g., first, second, and third layers, which are vertically stacked on top of one another. In this case, the first and third layers may include titanium, and the second layer between the first and third layers may include aluminum. The first and third layers may have the same thickness in a vertical direction, and the thickness of the second layer may be larger than that of the first (or third) layer.

Furthermore, the first pattern 200 may include metal or transparent conductive oxide (TCO). Transparent conductive oxide (TCO) may include at least one of indium tin oxide (ITO), indium zinc oxide (IZO), zinc oxide (ZnO), carbon nanotubes (CNTs), and graphene.

The first insulating layer 130 is disposed on the first pattern 200 and the buffer layer 120, and the second pattern 300 is disposed on the first insulating layer 130. The first insulating layer 130 may electrically insulate the first pattern 200 and the second pattern 300 from each other, and may insulate various electrodes, included in the first pattern 200, from each other.

Furthermore, the first insulating layer 130 functions to flatten the surface of the second pattern 300. In other words, the first insulating layer 130 and the second pattern 300 may not be influenced by stepped portions attributable to the first pattern 200. Accordingly, the top surface of the first insulating layer 130 and the bottom surface of the second pattern 300, which come into contact with each other, are flat.

In an exemplary embodiment, the first insulating layer 130 may be an organic layer including an organic material. The organic layer may include at least one selected from the group consisting of photoresist, acrylic resin, polyimide resin, polyamide resin, siloxane resin, resin containing a photosensitive acrylic carboxyl group, novolak resin, and alkali-soluble resin.

In an exemplary embodiment, an inorganic layer (see inorganic layer 150 of FIG. 7) is included on (or beneath) the first insulating layer 130, e.g., an organic layer. The first insulating layer 130 performs a flattening function, as described above, and the inorganic layer 150 functions to prevent moisture and impurities from penetrating like the buffer layer 110. Furthermore, the inorganic layer 150 may firmly couple the second pattern 300 disposed thereon. The inorganic layer 150 may include silicon oxide $SiO_x$ or silicon nitride $SiN_x$.

The second pattern 300 may include any one of the materials described in connection with the first pattern 200. The second pattern 300 may include a material identical to or different from that of the first pattern 200.

The second insulating layer 140 is disposed on the second pattern 300 and the first insulating layer 130. The second insulating layer 140 insulates various electrodes, included in the second pattern 300, from each other. The second insulating layer 140 may include any one of the materials described in connection with the first insulating layer 130. The second insulating layer 140 may include a material identical to or different from that of the first insulating layer 130.

The cover glass CG may be located on the touch sensing unit TS. The cover glass CG may include any one selected from the group consisting of glass, sapphire, diamond, polymethylmethacrylate (PMMA), and polycarbonate (PC).

The schematic structure of the touch sensing unit TS will be described with reference to FIGS. 2a to 2c.

Figure 2A:
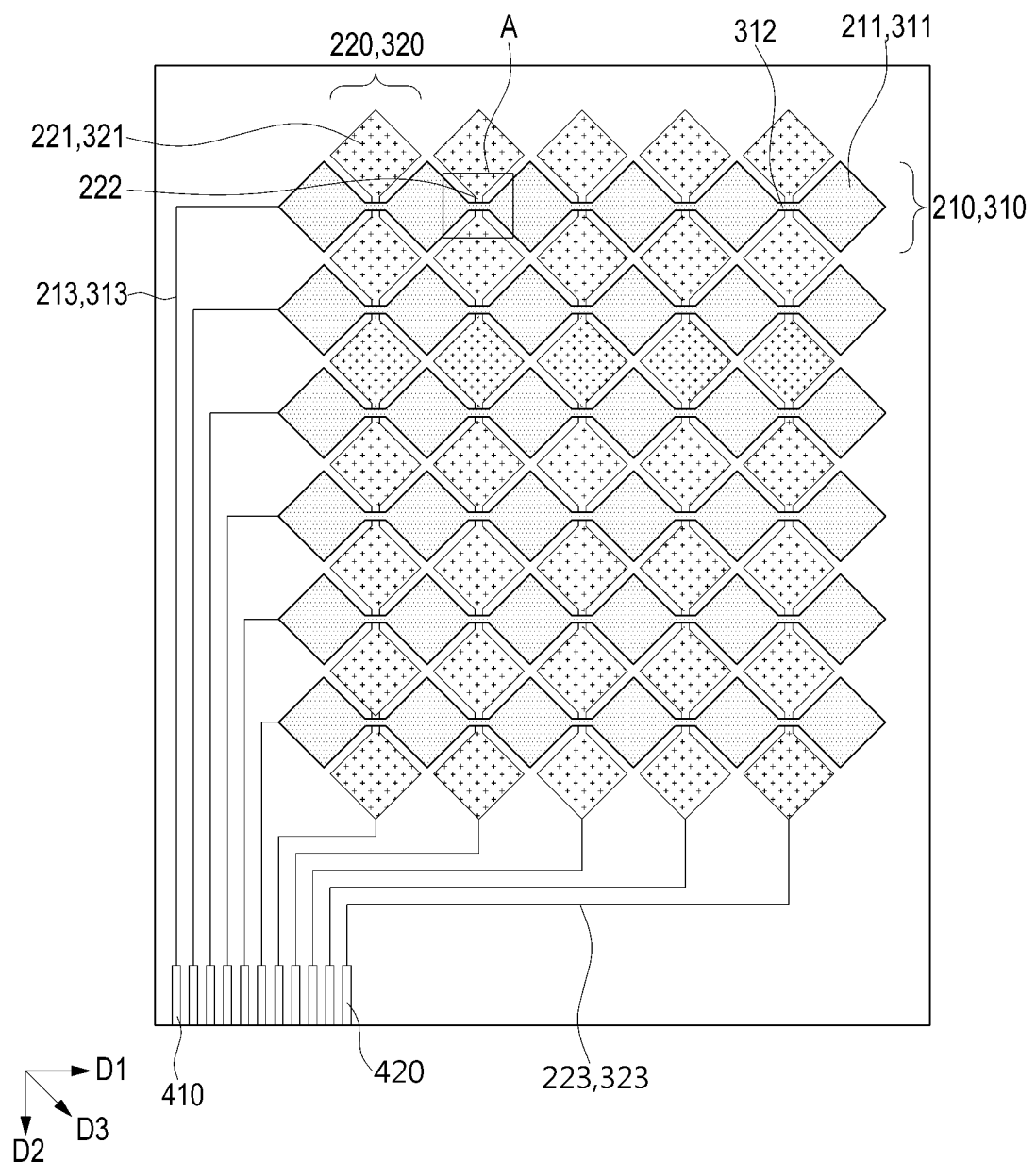
FIG. 2a is a plan view of the display device according to the present exemplary embodiment.

FIG. 2a is a plan view of the display device according to the present exemplary embodiment. FIGS. 2b and 2c are plan views of the first pattern 200 and the second pattern 300, respectively.

As described above, the first pattern 200 may refer to the substrate of the display panel DP, more specifically any pattern disposed on the encapsulation layer 110 or disposed on the buffer layer 120 on the encapsulation layer 110. The second pattern 300 may refer to any pattern disposed on the first insulating layer 130.

Figure 2B:
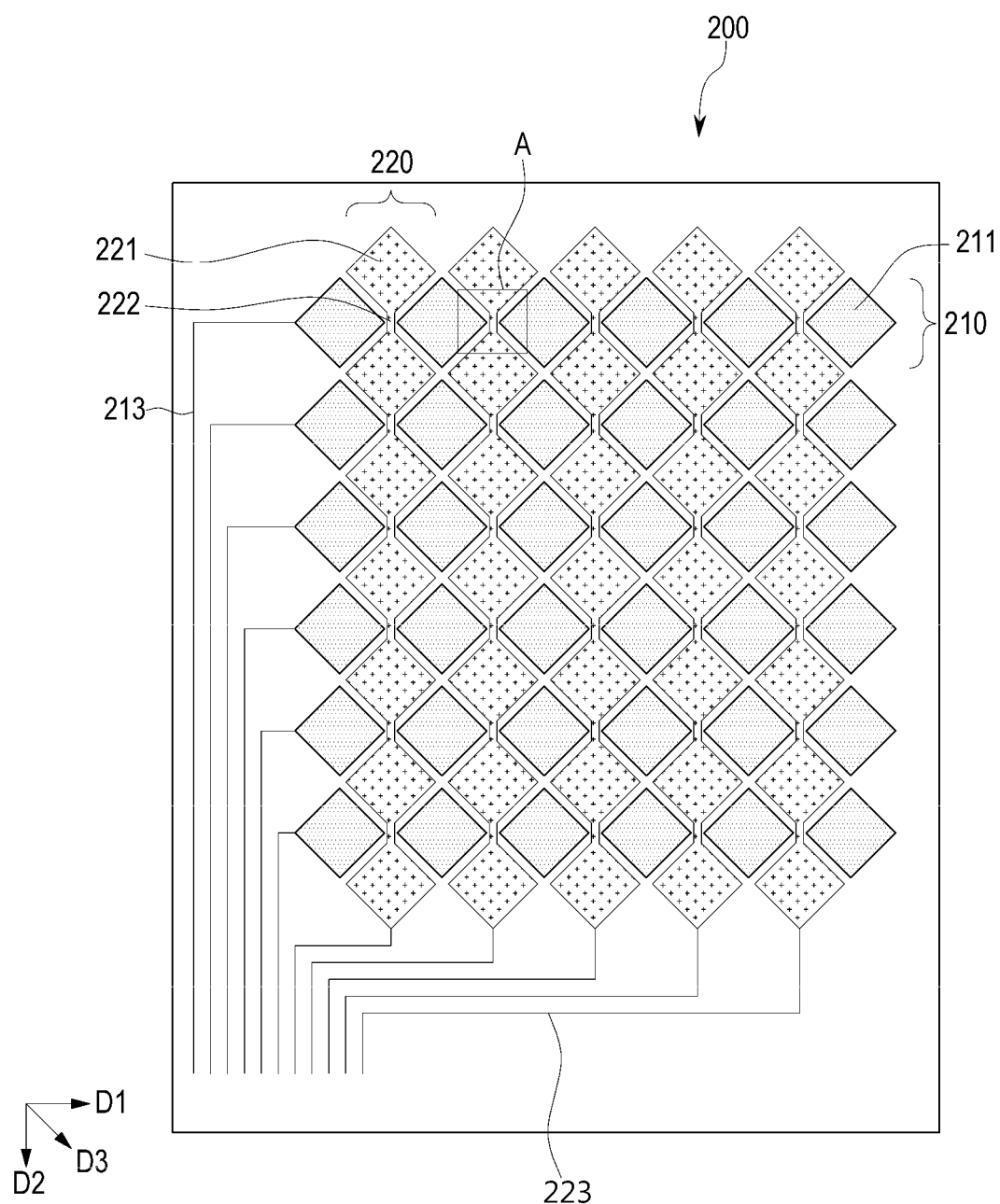
FIGS. 2b and 2c are plan views of a first pattern and a second pattern, respectively.
Figure 2C:
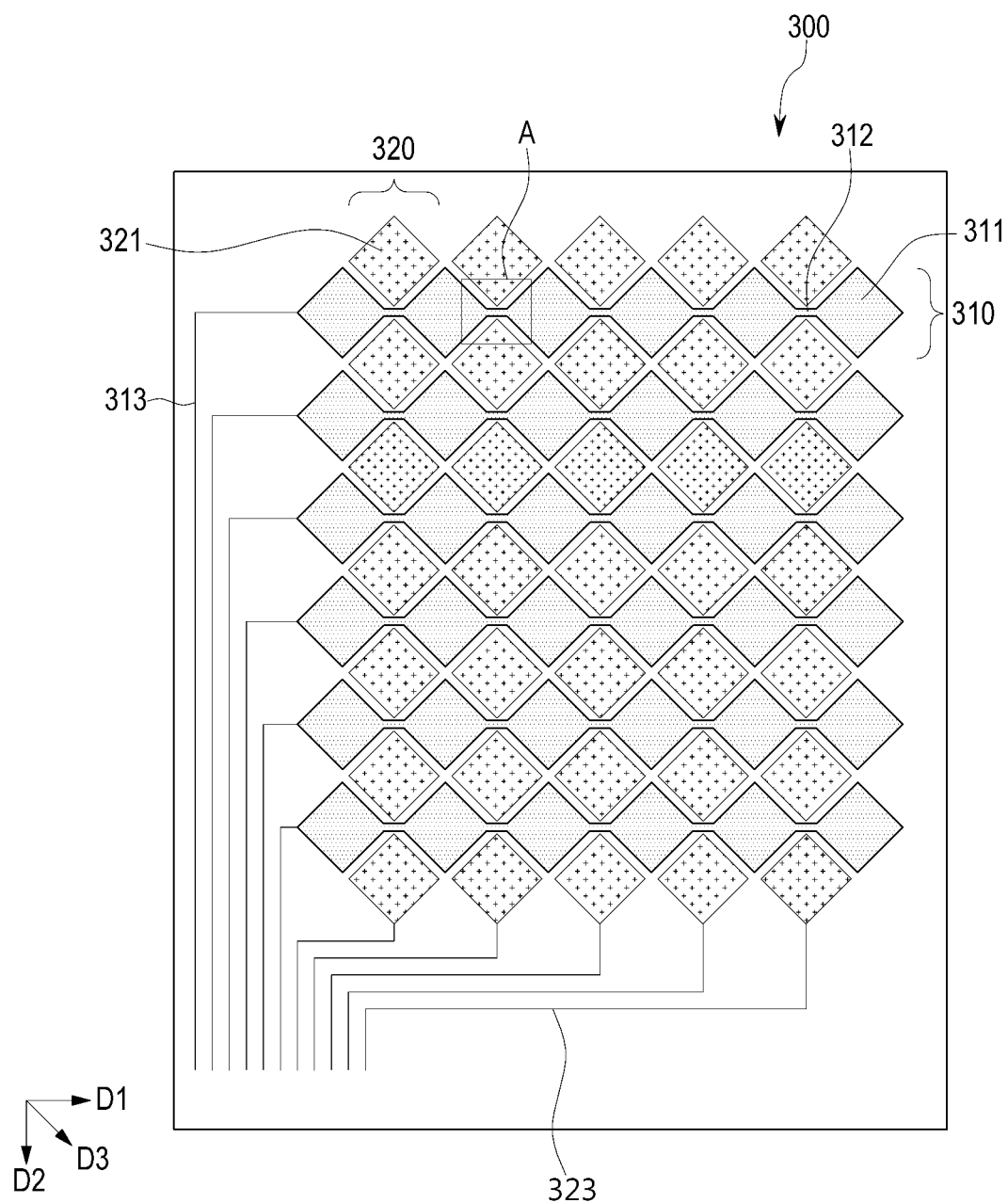

As shown in FIGS. 2a to 2c, the touch sensing unit TS includes a plurality of first detection units 210 and 310 and a plurality of second detection units 220 and 320.

The plurality of first detection units 210 and 310 are spaced apart from each other in a second direction D2. In this case, the first detection units 210 and 310 have a line shape which extends in a first direction D1.

Each of the first detection units 210 and 310 includes a plurality of first sensing electrodes 211 and 311. For example, any one of the first detection units 210 and 310 includes a plurality of first sensing electrodes 211 and 311 which are arranged in the first direction D1. The first sensing electrodes 211 and 311 have a multi-layer structure. In other words, the first sensing electrodes 211 and 311 include sensing electrodes 211 (hereinafter referred to as "first-first sensing electrodes 211") corresponding to the first pattern 200, and sensing electrodes 311 (hereinafter referred to as "first-second sensing electrodes 311") corresponding to the second pattern 300.

Referring to FIG. 2c, first-second sensing electrodes 311 included in any one of the first detection units 310 are directly connected to one another via first connection electrodes 312. The first-second sensing electrodes 311 and the first connection electrodes 312 included in the first detection unit 310 may be integrated with one another to form a third sub-pattern.

Referring to FIG. 2b, the first-first sensing electrodes 211 included in any one of the first detection units 210 are not directly connected to one another to form a second sub-pattern. The first-first sensing electrodes 211 and the first-second sensing electrodes 311, which overlap each other, may be connected to each other via contact holes (see contact holes 131 of FIG. 3a) defined in the first insulating layer 130. In another exemplary embodiment, the first-first sensing electrodes 211 and the first-second sensing electrodes 311, which overlap each other, may not be connected to each other, and the first-first sensing electrodes 211 may be floating electrodes.

Figure 8:
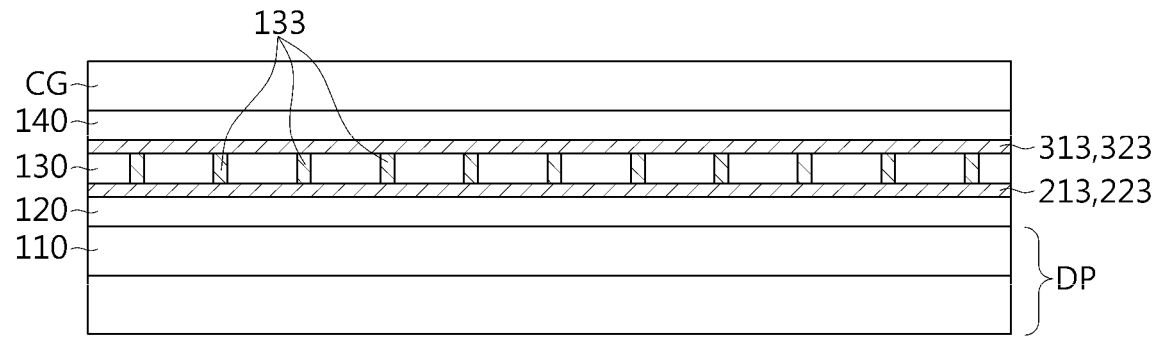
FIG. 8 is a sectional view taken along the lengthwise direction of a transmission line according to an exemplary embodiment.

Referring to FIGS. 2a, 2b, 2c, and 8, the first sensing electrodes 211 and 311 included in any one of the first detection units 210 and 310 are connected to a first pad electrode 410 via first transmission lines 213 and 313. The first transmission lines 213 and 313 have a multi-layer structure. In other words, the first transmission lines 213 and 313 include a transmission line 213 (hereinafter referred to as a "first-first transmission line 213") corresponding to the first pattern 200, and a transmission line 313 (hereinafter referred to as a "first-second transmission line 313") corresponding to the second pattern 300. Referring to FIG. 8, the first-first transmission lines 213 and the first-second transmission lines 313, which overlap each other, are connected to each other via contact holes 133 defined in the first insulating layer 130.

For example, the outermost ones of the first-first sensing electrodes 211 may be connected to the first pad electrodes 410 via the first-first transmission lines 213. The outermost ones of the first-second sensing electrodes 311 may be connected to the first pad electrodes 410 via the first-second transmission lines 313. Alternatively, only any one of the first-first transmission line 213 and the first-second transmission line 313, e.g., the first-second transmission line 313, may be connected to the first pad electrode 410. The outermost first-second sensing electrodes 311, the outermost first-second transmission lines 313, and the outermost first pad electrodes 410 may be integrated with one another.

The first sensing electrodes 211 and 311 included in any one of the first detection units 210 and 310 and the first sensing electrodes 211 and 311 included in another of the first detection units 210 and 310 are connected to different first transmission lines 213 and 313. The individual first transmission lines 213 and 313 are independently connected to different first pad electrodes 410.

The first sensing electrodes 211 and 311 may have a rhombic shape. Alternatively, the first sensing electrodes 211 may have a rectangular shape or triangular shape. The first sensing electrodes 211 and 311 may have the same shape as the pixels PX. The first sensing electrodes 211 and 311 may also include at least one of titanium (Ti), aluminum (Al), silver (Ag), copper (Cu), chromium (Cr), and nickel (Ni).

The plurality of second detection units 220 and 320 are spaced apart from each other in the first direction D1. In this case, the second detection units 220 and 320 have a line shape which extends in the second direction D2.

Each of the second detection units 220 and 320 includes a plurality of second sensing electrodes 221 or 321. For example, any one of the second detection units 220 and 320 includes a plurality of second sensing electrodes 221 or 321 which are arranged in the second direction D2. The second sensing electrodes 221 and 321 have a multi-layer structure. In other words, the second sensing electrodes 221 and 321 include a sensing electrode 221 (hereinafter referred to as a "second-first sensing electrode 221") corresponding to the first pattern 200 and a sensing electrode 321 (hereinafter referred to as a "second-second sensing electrode 321") corresponding to the second pattern 300.

Referring to FIG. 2b, the second-first sensing electrodes 221 included in any one of the second detection units 220 are directly connected to one another via second connection electrodes 222. The second-first sensing electrodes 221, included in the second detection unit 220, and the second connection electrodes 222 may be integrated with one another to form a first sub-pattern.

Referring to FIG. 2c, the second-second sensing electrodes 321 included in any one of the second detection unit 320 are not directly connected to one another to form a fourth sub-pattern. The second-first sensing electrodes 221 and the second-second sensing electrodes 321, which overlap each other, may be connected to each other via contact holes defined in the first insulating layer 130 (see contact holes 132 of FIG. 3a). In another exemplary embodiment, the second-first sensing electrodes 221 and the second-second sensing electrodes 321, which overlap each other, may not be connected to each other, and the second-second sensing electrodes 321 may be floating electrodes.

The second sensing electrodes 221 and 321 included in any one of the second detection units 220 and 320 are connected to a second pad electrode 420 via second transmission lines 223 and 323. The second transmission lines 223 and 323 have a multi-layer structure. In other words, the second transmission lines 223 and 323 include a transmission line 223 (hereinafter referred to as a "second-first transmission line 223") corresponding to the first pattern 200 and a transmission line 323 (hereinafter referred to as a "second-second transmission line 323") corresponding to the second pattern 300. Referring to FIG. 8, the second-first transmission lines 223 and the second-second transmission lines 323, which overlap each other, are connected via the contact holes 133 defined in the first insulating layer 130.

For example, the outmost ones of the second-first sensing electrodes 221 may be connected to the second pad electrodes 420 via the second-first transmission lines 223. The outermost ones of the second-second sensing electrodes 321 may be connected to the second pad electrodes 420 via the second-second transmission lines 323. Alternatively, any one of the second-first transmission line 223 and the second-second transmission line 323, e.g., the second-second transmission line 323, may be connected to the second pad electrode 420. The outermost second-second sensing electrodes 321, the outermost second-second transmission lines 323, and the outermost second pad electrodes 420 may be integrated with each other.

The second sensing electrodes 221 and 321 included in any one of the second detection units 220 and 320 and the second sensing electrodes 221 and 321 included in another of the second detection units 220 and 320 are connected to different second transmission lines 223 and 323. The second transmission lines 223 and 323 are independently connected to different second pad electrodes 420.

The second sensing electrodes 221 and 321 may have the same shape as the first sensing electrodes 211 and 311. The second sensing electrodes 221 and 321 may have the same material as the first sensing electrodes 211 and 311. For example, the second sensing electrodes 221 and 321 may also include at least one of titanium (Ti), aluminum (Al), silver (Ag), copper (Cu), chromium (Cr), and nickel (Ni).

The first sensing electrodes 211 and 311 and the second sensing electrodes 221 and 321 are alternately arranged in a third direction D3. The third direction D3 in a plane defined by the first direction D1 and the second direction D2 intersects the first direction D1 and the second direction D2. The first sensing electrodes 211 and 311 and the second sensing electrodes 221 and 321 may include the same material, and may be arranged in a multilayer. For the sake of distinction, the insides of the first sensing electrodes 211 and 311 and the insides of the second sensing electrodes 221 and 321, which are shown in FIGS. 2a to 2c, are filled with different patterns.

The first sensing electrodes 211 and 311 and the second sensing electrodes 221 and 321 form touch sensors configured to detect a touch. In this case, the touch may include not only a case where an object comes into contact with the touch panel (a contact touch) but also a case where hovering is performed in the state of being close to or having approached the touch panel (a non-contact touch).

Meanwhile, the first sensing electrodes 211 and 311 are connected to the driving part (not shown) of the display panel DP via the first pad electrodes 410, and the second sensing electrodes 221 and 321 are connected to the driving part via the second pad electrodes 420. The driving part supplies driving signals to the second sensing electrodes 221 and 321, and receives output signals from the first sensing electrodes 211 and 311. Conversely, the driving part may supply driving signals to the first sensing electrodes 211 and 311, and may receive output signals from the second sensing electrodes 221 and 321.

In summary, the first detection units 210 and 310 include the first-first sensing electrodes 211, the first-second sensing electrodes 311, and the first connection electrodes 312, and the second detection units 220 and 320 include the second-first sensing electrodes 221, the second-second sensing electrodes 321, and the second connection electrodes 222.

The first-first sensing electrodes 211, the second-first sensing electrodes 221, the second connection electrodes 222, the first-first transmission lines 213, and the second-first transmission lines 223 are formed as the first pattern. The second-first sensing electrodes 221, the second connection electrodes 222, and the second-first transmission lines 223 may be integrated into the first sub-pattern. The first-first sensing electrodes 211 form the second sub-pattern separate from the first sub-pattern.

The first-second sensing electrodes 311, the second-second sensing electrodes 321, the first connection electrodes 312, the first-second transmission lines 313, and the second-second transmission lines 323 are formed as the second pattern 300. The first-second sensing electrodes 311, the first connection electrodes 312, and the first-second transmission lines 313 may be integrated into the third sub-pattern. The second-second sensing electrodes 321 forms the fourth sub-pattern separate from the third sub-pattern.

The first pattern 200 and the second pattern 300 include the above-described material. On a plane, the first pattern 200 and the second pattern 300 have corresponding shapes, and the second pattern 300 is larger than the first pattern 200 such that the second pattern 300 can cover the first pattern 200. A detailed description thereof will be given with reference to FIGS. 3a to 6 below.

Figure 3A:
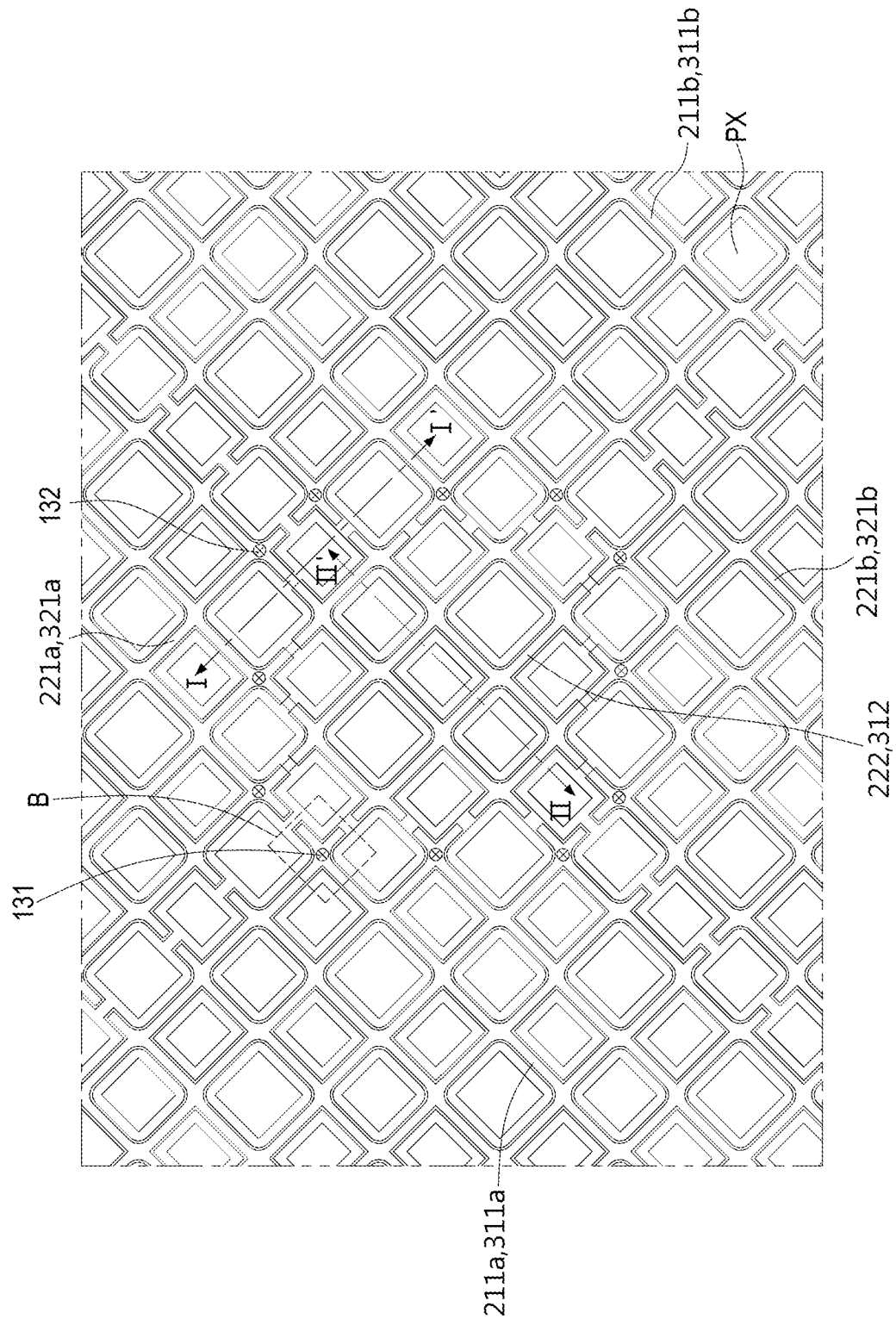
FIGS. 3a, 3b, and 3c are enlarged views of portion A of FIGS. 2a, 2b, and 2c, respectively.
Figure 3B:
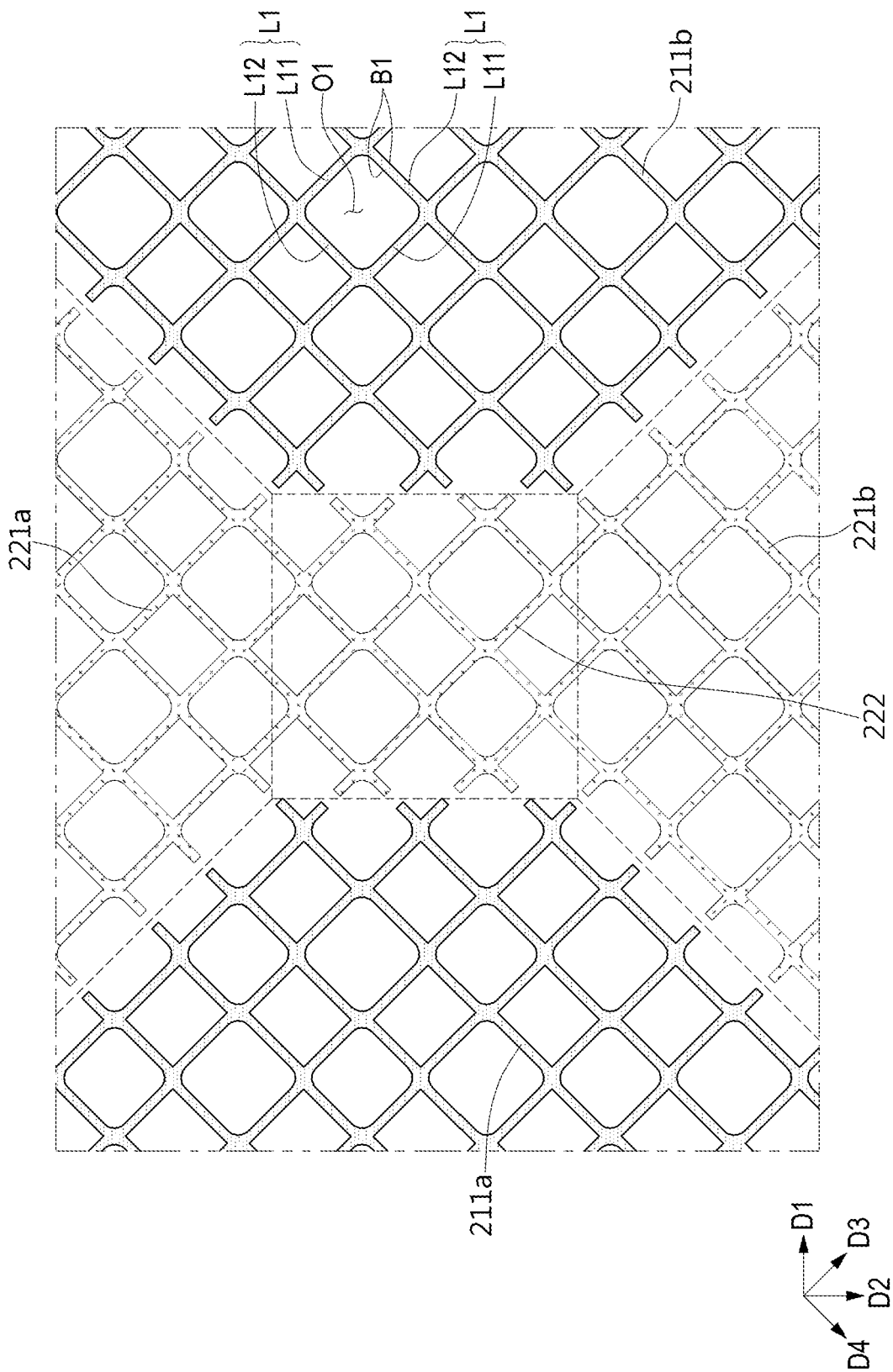
Figure 3C:
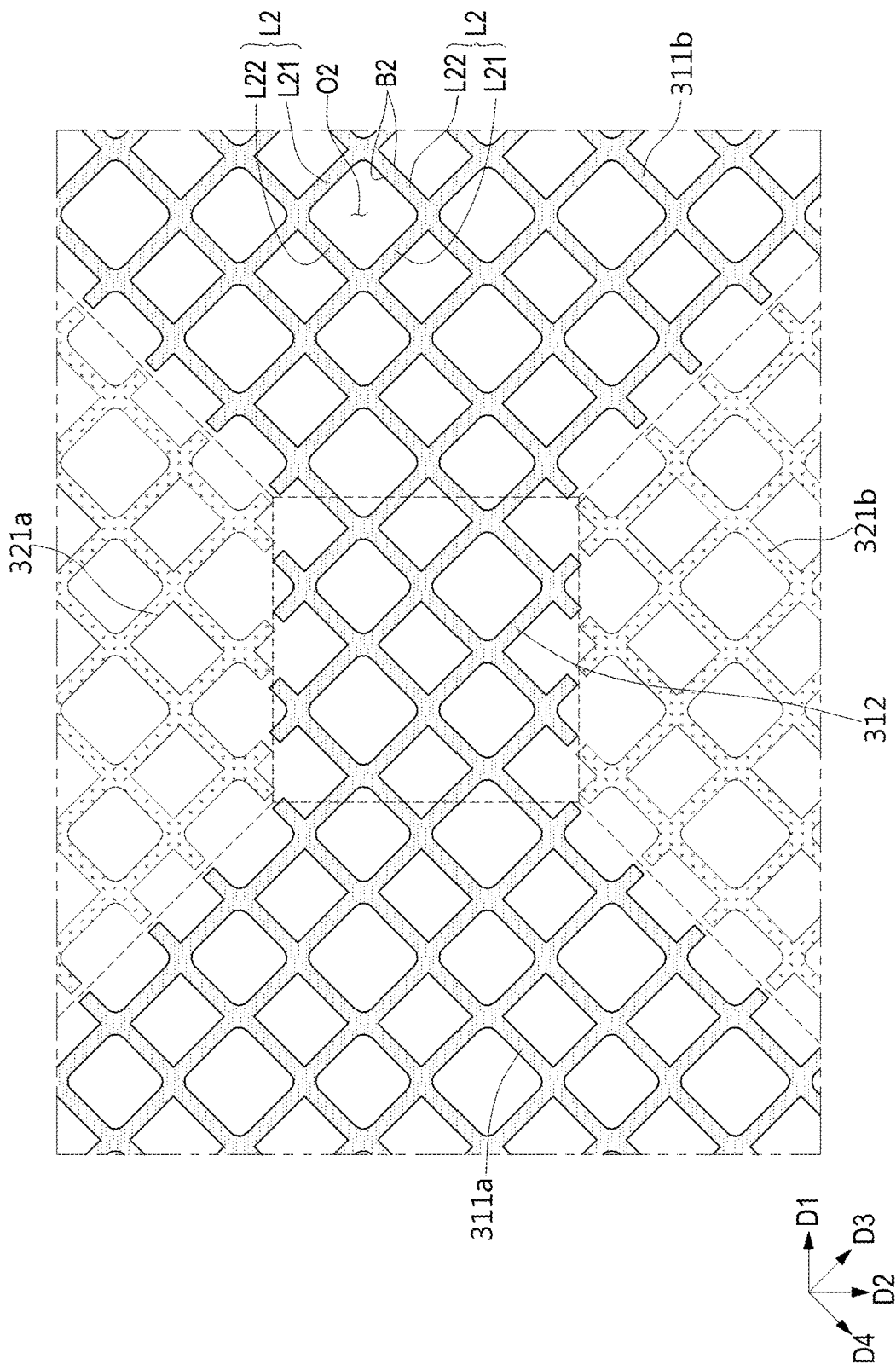
Figure 4:
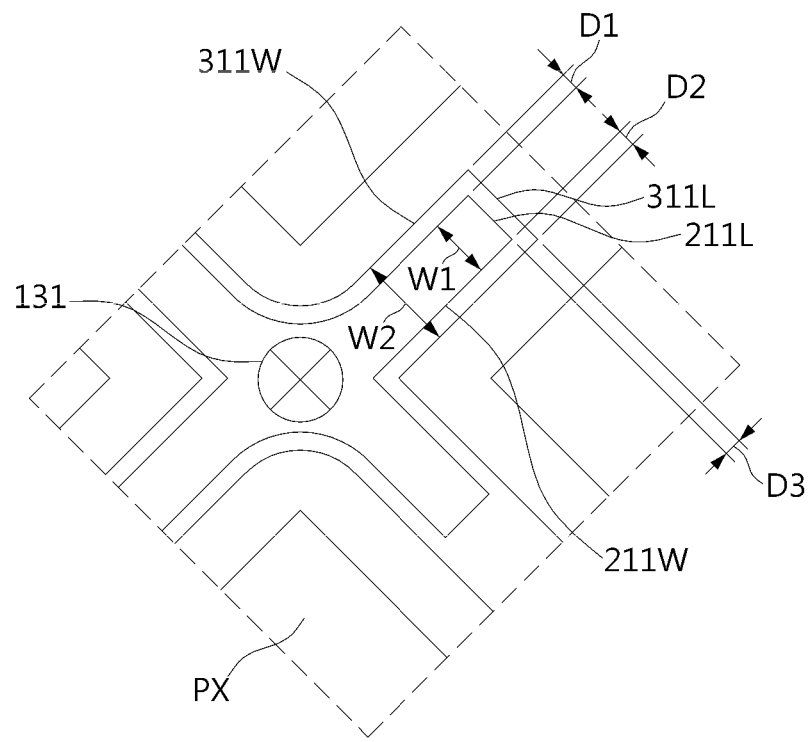
Figure 5:
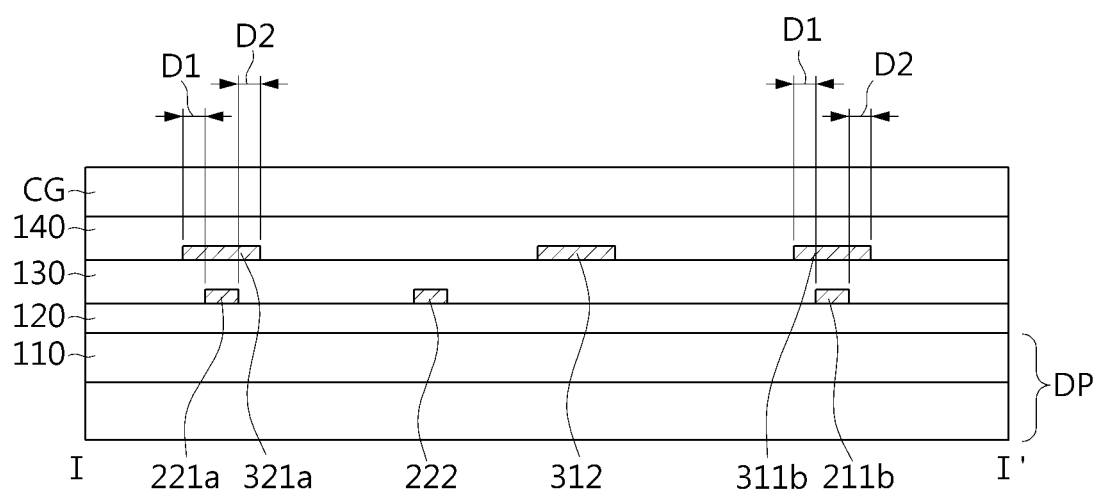
Figure 6:
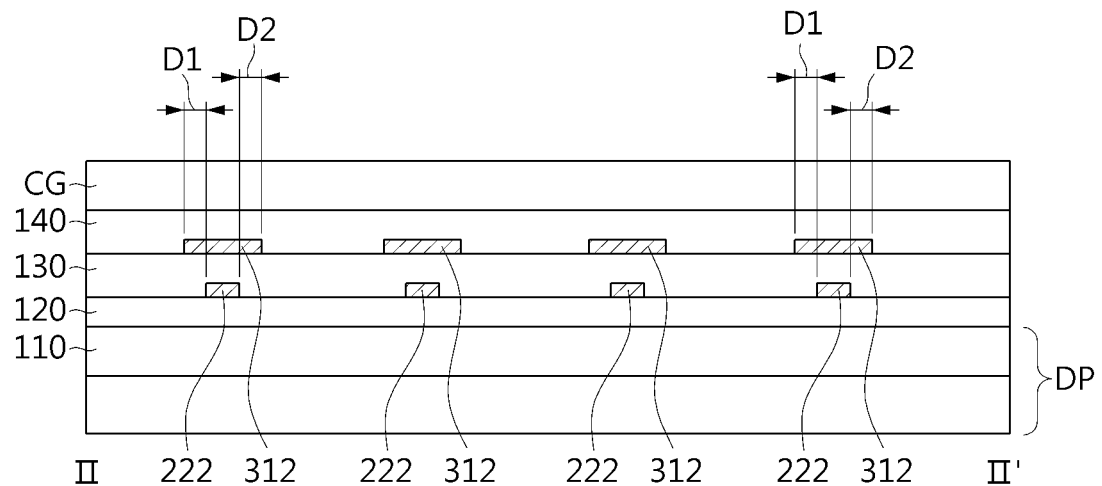
FIG. 6 is a sectional view taken along line II-II' of FIG. 3a according to one exemplary embodiment of the present disclosure.

FIGS. 3a, 3b, and 3c are enlarged views of portion A of FIGS. 2a, 2b, and 2c, respectively. FIG. 4 is an enlarged view of portion B of FIG. 3a. FIG. 5 is a sectional view taken along line I-I' of FIG. 3a. FIG. 6 is a sectional view taken along line II-II' of FIG. 3a.

As shown in FIGS. 3a to 3c, the first pattern 200 of FIG. 3b and the second pattern 300 of FIG. 3c correspond to each other. More specifically, the first pattern 200 and the second pattern have the same shape on a plane.

For example, the first pattern 200 and the second pattern 300 may be mesh patterns including intersecting lines L1 and L2.

More specifically, the lines L1 of the first pattern 200 may include a plurality of first lines L11 and a plurality of second lines L12 intersecting the first lines L11. The lines L2 of the second pattern 300 may include a plurality of first lines L21 and a plurality of second lines L22 intersecting the first lines L21, respectively. On a plane, the first lines L11 and L21 are parallel to each other, and the second lines L12 and L22 are parallel to each other. The lines L1 of the first pattern 200 overlap the lines L2 of the second pattern 300 on a plane. The first lines L11 and L12 have a line shape which extends in the third direction D3, and the second lines L12 and L22 have a line shape which extends in the fourth direction D4 vertical to the third direction D3 in the plane defined by the first direction D1 and the second direction D2. A region surrounded by two first lines L11 and two second lines L12, i.e., four rectilinear lines, corresponds to an opening or hole O1 of the first pattern 200, and a single hole O1 exposes one or more pixels PX. A region surrounded by two first lines L21 and two second lines L22, i.e., four rectilinear lines, corresponds to an opening or hole O2 of the first pattern 300, and a single hole O2 exposes the pixels PX exposed by the single hole O1.

As shown in FIG. 3a, the lines L1 and L2 forming the first pattern 200 and the second pattern 300 may be disposed between the pixels PX to prevent the lines L1 and L2 from covering the light-emitting regions of the pixels PX. For example, in the case of an organic light-emitting display panel, the lines L1 and L2 of the first pattern 200 and the second pattern 300 may be disposed on the pixel defining layer which defines the pixels PX.

However, the lines L1 and L2 of the first pattern 200 and the second pattern 300 are not limited thereto. The first pattern 200 and the second pattern 300 may be patterns having various shapes. For example, the first pattern 200 and the second pattern 300 may include surfaces. The first pattern 200 and the second pattern 300 may be patterns including holes which are regularly arranged or which are configured to overlap and expose one or more pixels PX of the display panel DP.

As shown in FIGS. 3b and 3c, the first pattern 200 and the second pattern 300 each have a mesh shape which includes a plurality of lines intersecting on a plane and which defines a plurality of openings O1 or O2. The first pattern 200 and the second pattern 300 have the same shape except that the locations at which the patterns are cut (connected) in central connection electrodes 222 and 312 are different and the widths of the lines L1 and L2 forming the patterns are different. In other words, the line L1 of the first pattern 200 and the line L2 of the second pattern 300 overlap each other in parallel with each other on a plane. The width of each of the lines L1 and L2 is defined as a distance between two boundary lines B1 and B2 on both sides in a widthwise direction.

Referring to FIGS. 3b and 5, the first pattern 200 is cut in the diagonal directions of each second connection electrode 222, and is also cut in the vertical direction D2 on the left and right sides of the second connection electrode 222. Accordingly, the second-first sensing electrodes 221a and 221b in the vertical direction D2 are connected by the second connection electrodes 222 and form the first sub-pattern, and the first-first sensing electrodes 211a and 211b in the left and right direction D1 are separate from each other and form the second sub-pattern. Furthermore, the second-first sensing electrodes 221a and 221b are separate from the first-first sensing electrodes 211a and 211b.

Referring to FIGS. 3c and 5, the second pattern 300 is cut in the diagonal directions D3 and D4 of each first connection electrode 312, and is also cut in lateral direction D1 on the top and bottom sides of the first connection electrode 312. Accordingly, the first-second sensing electrodes 311a and 311b in the lateral direction D1 are connected by the first connection electrodes 312 and form the third sub-pattern, and the second-second sensing electrodes 321a and 321b in the vertical direction D2 are separate from each other and form the fourth sub-pattern. Furthermore, the first-second sensing electrodes 311a and 311b are separate from the second-second sensing electrodes 321a and 321b.

Referring to FIG. 3a, the separate first-first sensing electrodes 211a and 211b (the second sub-pattern) shown in FIG. 3b are connected to the first-second sensing electrodes 311a and 312a (the third sub-pattern) via the contact holes 131 defined in the first insulating layer 130. The separate second-second sensing electrodes 321a and 321b (the fourth sub-pattern) shown in FIG. 3c are connected to the second-first sensing electrodes 221a and 221b (the first sub-pattern) via the contact holes 132 defined in the first insulating layer 130.

As shown in FIGS. 3a to 3c, the boundary lines B1 of the lines L1 of the first pattern 200 is covered with the lines L2 of the second pattern 300 on a plane.

The boundary lines or contour lines B1 of the first pattern 200 refer to boundaries between the first insulating layer 130 and the first pattern 200 (more specifically the lines L1 of the first pattern 200) on a plane, more specifically on the top surface of the buffer layer 120. Alternatively, boundary lines B on the plane of the first pattern 200 refer to side surfaces which come into contact with the first insulating layer 130 on the sectional view of the first pattern 200 (more specifically the lines L1 forming the first pattern 200).

As in the first pattern 200, the boundary lines or contour lines B2 of the second pattern 300 refer to boundaries between the second insulating layer 140 and the second pattern 300 (more specifically the lines L2 forming the second pattern 300) on a plane, more specifically on the top surface of the first insulating layer 130. Alternatively, the boundary lines B2 on the plane of the second pattern 300 may refer to side surfaces which come into contact with the second insulating layer 140 on the sectional view of the second pattern 300 (more specifically the lines L2 forming the second pattern 300).

The boundary lines B1 of the lines L1 of the first pattern 200 are the same as the boundary lines B1 of the openings O1 defined by the first pattern 200, and the boundary lines B2 of the lines L2 of the second pattern 300 are the same as the boundary lines B2 of the openings O2 defined by the second pattern 300.

As shown in FIGS. 3a, 4, 5, and 6, the overall first pattern 200, except for only some (the cut locations between the first connection electrodes 312 and second-second sensing electrodes 321 of the second pattern 300; see second connection electrode 222 of FIG. 5), is covered with the second pattern 300 when viewed on a plane. The boundary lines B1 of the first pattern 200 or the boundary lines of the openings O1 of the first pattern 200 are covered with the second pattern 300. In other words, the boundary lines B1 of the first pattern 200 are spaced apart from the boundary lines B2 of the second pattern 300 by a predetermined distance larger than 0, and are located within the boundary lines B2 of the second pattern 300. Some of the lines L2 of the second pattern 300 overlap some of the openings O1 of the first pattern 200 on a plane. The lines L1 of the first pattern 200 do not overlap the openings O2 of the second pattern 300 on a plane. The boundary lines B1 of the first pattern 200 (the boundary lines of the openings O1) are parallel to the boundary lines B2 of the second pattern 300 (the boundary lines of the openings O2) on a plane.

Referring to FIGS. 3a, 5, and 6, the first-first sensing electrodes 211 of the first pattern 200 are covered with the first-second sensing electrodes 311 of the second pattern 300. The second-first sensing electrodes 221 of the first pattern 200 are covered with the second-second sensing electrodes 321 of the second pattern 300. The second connection electrodes 222 of the first pattern 200 are covered with the first connection electrodes 312 of the second pattern 300.

Referring to FIGS. 4 to 6, the boundary lines B1 of the first pattern 200 are spaced apart from the boundary lines B2 of the second pattern 300 by a predetermined distance D1, D2, or D3. The boundary lines B1 of the first pattern 200 overlap the second pattern 300, are covered with the second pattern 300, and the boundary lines B2 of the second pattern 300 do not overlap the first pattern 200. In other words, the boundary lines B1 of the first pattern 200 are located inside the boundary lines B2 of the second pattern 300. The boundary lines of the first pattern 200 may be parallel to the boundary lines of the second pattern 300.

Referring to FIG. 4, based on the lines L1 and L2 of the first pattern 200 and the second pattern 300, the lines L1 of the first pattern 200 have a width W1, and the lines L2 of the second pattern 300 have a width W2. The lines L1 is defined by the boundary lines B1. The boundary lines B1 may be include both boundary lines 211W and one-side boundary line 211L. The lines L2 is defined by the boundary lines B2. The boundary lines B2 may be include both boundary lines 311W and one-side boundary line 311L. Both boundary lines 211W of the first pattern 200 (e.g., the first-first sensing electrode 211) in the widthwise direction and both boundary lines 311W of the second pattern 300 (e.g., the first-second sensing electrode 311) in the widthwise direction are parallel to each other, and are spaced apart from each other by a distance D1 (one side in the widthwise direction) or D2 (the other side in the widthwise direction). Accordingly, the width W1 of the lines of the first pattern 200 is smaller than the width W2 of the lines of the second pattern 300 by D1+D2.

The one-side boundary line 211L of the first pattern 200 (e.g., the first-first sensing electrode 211) in the lengthwise direction and the one-side boundary line 311L of the second pattern 300 (e.g., the first-second sensing electrode 311) in the lengthwise direction are parallel to each other, and are spaced apart from each other by a distance D3.

Referring to FIGS. 3a to 4, based on the openings O1 and O2 of the first pattern 200 and the second pattern 300, each of the openings O1 of the first pattern 200 has a larger area than each of the openings O2 of the second pattern 300 which overlap each of the openings O1 of the first pattern 200. For example, the openings O1 and O2 have rectangular boundary lines B1 and B2. For example, the boundary lines B1 and B2 are polygonal shapes each having four or more rectilinear lines. The boundary line B1 of the opening O1 of the first pattern 200 is located outside the boundary line B2 of the opening O2 of the second pattern 300 on a plane, and the two boundary lines B1 and B2 are closed and may not intersect each other. The two boundary lines B1 and B2 of the openings O1 and O2, which overlap each other, are parallel to each other, and are spaced apart from each other by a predetermined distance.

The distances D1, D2 and D3, generally referred to as the distances D, between the boundary lines B1 of the first pattern 200 and the boundary lines B2 of the second pattern 300 are larger than 0. In an exemplary embodiment of the present disclosure, the distances D1, D2, AND D3 are equal to or larger than 0.1 µm. Suitably, the distances D1, D2, AND D3 are equal to or larger than 0.2 µm. More suitably, the distances D1, D2, AND D3 are equal to or larger than 0.35 µm. The width W1 of the lines L1 of the first pattern 200 is smaller than the width W2 of the lines L2 of the second pattern 300. In an exemplary embodiment of the present disclosure, the width W1 is smaller than the width W2 by more than 0.2 µm. Suitably, the width W1 is smaller than the width W2 by more than 0.4 µm. More suitably, the width W1 is smaller than the width W2 by more than 0.7 µm.

Figure 7:
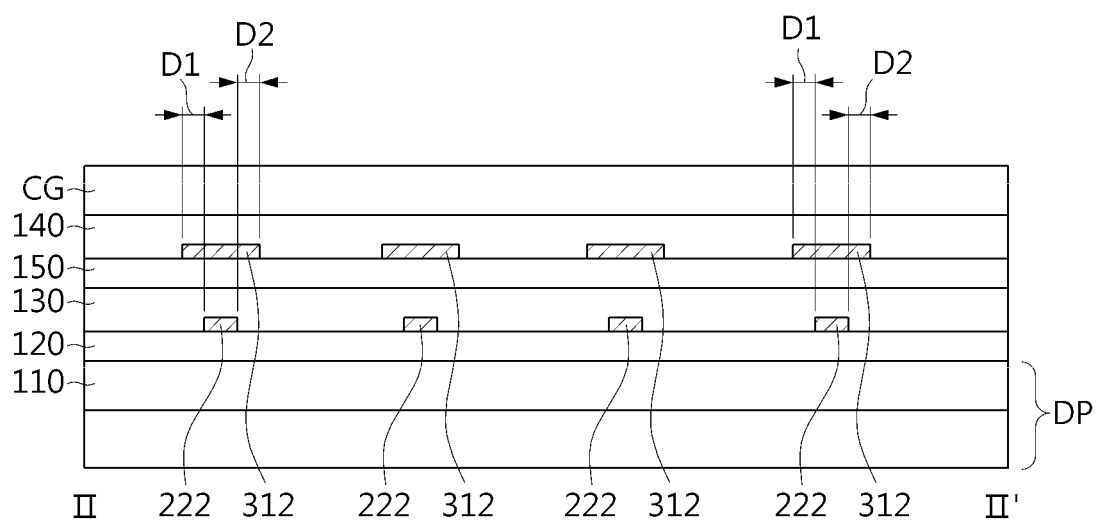
FIG. 7 is a sectional view taken along line II-IF of FIG. 3a according to another exemplary embodiment of the present disclosure.

Referring to FIGS. 5 to 7, the top surface of the first insulating layer 130 is flat, and the first insulating layer 130 and the second pattern 300 do not have a slope resulting from stepped portions attributable to the first pattern 200. Accordingly, the top surface of the first insulating layer 130 and the bottom surface of the second pattern 300, which come into contact with each other, are flat.

In an exemplary embodiment, the first insulating layer 130 may be an organic layer including an organic material. The organic layer having a flat top surface may be formed by exposing the organic material having fluidity to light and setting the organic material.

Referring to FIG. 7, the inorganic layer 150 may be included on the first insulating layer 130, e.g., an organic layer. The first insulating layer 130 performs a flattening function, as described above, and the inorganic layer 150 functions to prevent moisture and impurities from penetrating, like the buffer layer 110. Furthermore, the inorganic layer 150 may firmly couple the second pattern 300 disposed thereon. The inorganic layer 150 may include silicon oxide $SiO_x$ or silicon nitride $SiN_x$.

Referring to FIG. 8, the first-first transmission lines 213 and the first-second transmission lines 313, which overlap each other, are connected via the first contact holes 133 defined in the insulating layer 130. In the same manner, the second-first transmission lines 223 and the second-second transmission lines 323, which overlap each other, are connected via the contact holes 133 defined in the first insulating layer 130. In an exemplary embodiment, the first-first transmission lines 213 and the first-second transmission lines 313, which overlap each other, may include the above-described first pattern 200 and second pattern 300, respectively. For example, the width of the first-first transmission lines 213 is smaller than that of the first-second transmission lines 313. In another exemplary embodiment, the width of the first-first transmission lines 213 may be the same as that of the first-second transmission lines 313. The second-first transmission lines 223 and the second-second transmission lines 323, which overlap each other, are the same as described above. The transmission lines 213, 223, 313 and 323 may extend across the non-display area of the display panel DP.

Figure 9A:
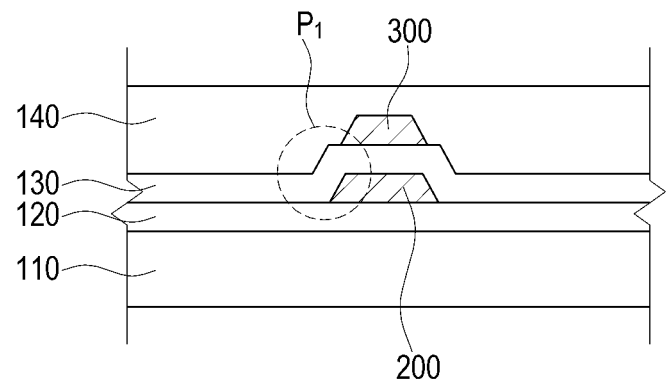
FIGS. 9a and 9b are views illustrating the reflection of light by a first pattern and a first insulating layer.

According to the above-described exemplary embodiment, the touch sensing unit having a multi-layer structure can improve sensitivity regarding a touch. However, as shown in FIG. 9a, it was found that when the side surfaces P1 of the first pattern 200 were exposed, light was reflected from the side surfaces, an image tear phenomenon (the deterioration of image quality attributable to the reflection of light) was observed. Furthermore, it was found that when the first insulating layer 130 was formed using an inorganic layer formed by depositing an inorganic material by means of chemical vapor deposition (CVD) or like, stepped portions P1 were formed in the first insulating layer 130 due to the stepped portions of the first pattern 200, and light was reflected from the stepped portions, thereby increasing an image tear phenomenon.

According to the present exemplary embodiment, the side surfaces of the first pattern 200 are covered with the second pattern 300, and thus light is reflected from the side surfaces, thereby reducing an image tear phenomenon.

Figure 9B:
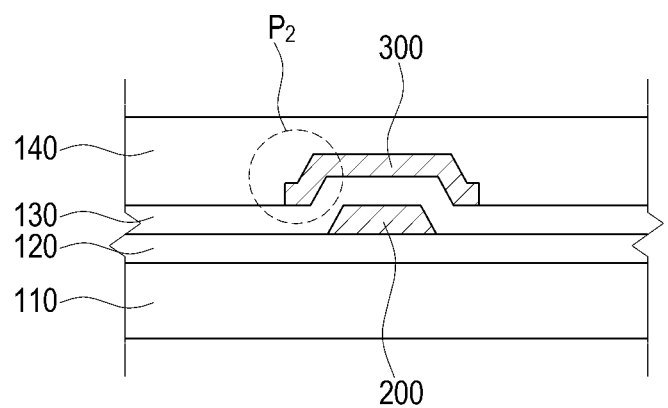

Meanwhile, as shown in FIG. 9b, even when the side surfaces of the first pattern 200 are covered with the second pattern 300, stepped portions are formed in the second pattern 300 due to the stepped portions P2 of the first insulating layer 130 including the inorganic layer. It was found that an image tear phenomenon was observed because light was reflected from the stepped portions P2.

According to the present exemplary embodiment, the side surfaces of the first pattern 200 are covered with the second pattern 300 and the first insulating layer 130 and the second pattern 300 are formed to be flat, and thus the reflection of light on the side surfaces of the first pattern 200 and the stepped portions of the first insulating layer 130 and the second pattern 300 can be reduced.

According to the present exemplary embodiment, it was found that an image tear phenomenon reduced to an intermediate level was observed compared to the case of FIGS. 9a, 9b when the distance between the boundary lines of the first pattern 200 and the second pattern 300 was 0.2 µm, and an image tear phenomenon was rarely observed when the distance was equal to or larger than 0.35 µm.

Accordingly, according to the above-described exemplary embodiment of the present disclosure, the image quality of the display device can be improved by reducing the amount of light reflected from the touch sensing unit.

Although the exemplary embodiments of the present disclosure have been described with reference to the accompanying drawings, it will be appreciated by those having ordinary knowledge in the art to which the present disclosure pertains that the inventive concept may be practiced in different forms without departing from the technical spirit or essential features of the inventive concept. Therefore, it should be understood that the above-described exemplary embodiments are illustrative but are not limitative in all aspects.

What is claimed is:

1. A display device comprising:
a display panel including a substrate; and
a touch sensing unit located on the substrate;
wherein the touch sensing unit includes:
a first pattern including a plurality of first lines;
a first insulating layer located on the first pattern; and
a second pattern located on the first insulating layer, and including a plurality of second lines overlapping the first lines in parallel with each other on a plane,
wherein the first pattern is between the substrate and the second pattern; and
wherein both side first boundary lines defining a width of each of the first lines are located inside both side second boundary lines defining a width of each of the second lines on the plane.

2. The display device of claim 1, wherein the touch sensing unit further includes a second insulating layer located on the first insulating layer and the second pattern.

3. The display device of claim 1, wherein each of the first boundary lines and a corresponding one of the second boundary lines, which are adjacent to each other, are parallel to each other.

4. The display device of claim 1, wherein an interval between each of the first boundary lines and a corresponding one of the second boundary lines, which are adjacent to each other, is equal to or larger than 0.2 µm.

5. The display device of claim 1, wherein an interval between each of the first boundary lines and a corresponding one of the second boundary lines, which are adjacent to each other, is equal to or larger than 0.35 µm.

6. The display device of claim 1, wherein the first pattern and the second pattern have an identical shape.

7. The display device of claim 1, wherein the width of the second lines is larger than the width of the first lines by 0.4 µm or more.

8. The display device of claim 1, wherein the width of the second lines is larger than the width of the first lines by 0.7 µm or more.

9. The display device of claim 1, wherein:
the display device includes a plurality of pixels on the substrate; and
each of the first lines and the second lines extends along a boundary between the pixels.

10. The display device of claim 9, wherein each of the first lines and the second lines has a mesh shape which surrounds at least one of the pixels.

11. The display device of claim 1, wherein the first pattern and the second pattern are metal.

12. The display device of claim 1, wherein a top surface of the first insulating layer is flat.

13. The display device of claim 12, wherein the first insulating layer includes an organic layer.

14. The display device of claim 13, wherein the second insulating layer includes an organic layer.

15. The display device of claim 13, further comprising an inorganic layer on the organic layer.

16. The display device of claim 1, wherein:
the display device further includes an encapsulation layer located on the substrate; and
the touch sensing unit is located on the encapsulation layer.

17. The display device of claim 16, wherein:
the display device further includes a buffer layer on the encapsulation layer; and
the touch sensing unit is located on the buffer layer.

18. The display device of claim 1, wherein:
the first pattern includes:
a plurality of first sub-patterns extending in a first direction, and spaced apart from each other in a second direction intersecting the first direction; and
a plurality of second sub-patterns separated from the plurality of first sub-patterns; and
the second pattern includes:
a plurality of third sub-patterns extending in the second direction, and spaced apart from each other in the first direction; and a plurality of fourth sub-patterns separated from the plurality of third sub-patterns.

19. The display device of claim 18, wherein the second sub-patterns overlap the third sub-patterns, and the first sub-patterns overlap the fourth sub-patterns.

20. The display device of claim 19, wherein the second sub-patterns and the third sub-patterns are coupled to each other and the first sub-patterns and the fourth sub-patterns are coupled to each via contact holes defined in the first insulating layer.

21. A display device comprising:
a display panel including a plurality of pixels; and
a touch sensing unit located on the display panel;
wherein the touch sensing unit includes:
   a first pattern including a mesh defining a plurality of first openings;
   a first insulating layer located on the first pattern; and
   a second pattern located on the first insulating layer, and including a mesh defining a plurality of second openings which overlap the plurality of first openings,
wherein the first pattern is between the display panel and the second pattern; and
wherein the first openings have an area larger than an area of the second openings.

22. The display device of claim 21, wherein the first openings are located inside the second openings on a plane.

23. The display device of claim 22, wherein the mesh of the second pattern overlaps the first openings on the plane, and the mesh of the first pattern does not overlap the second openings on the plane.

24. The display device of claim 21, wherein a boundary line of each of the first openings is parallel to a boundary line of a correspond one of the second openings.

25. The display device of claim 21, wherein a boundary line of each of the first openings does not intersect a boundary line of a correspond one of the second openings on a plane.

26. The display device of claim 21, wherein an interval between a boundary line of each of the first openings and a boundary line of a correspond one of the second openings is 0.2 μm or more on a plane.

27. The display device of claim 21, wherein an interval between a boundary line of each of the first openings and a boundary line of a correspond one of the second openings is 0.35 μm or more on a plane.

28. The display device of claim 21, wherein the area of the first openings and the area of the second openings are larger than an area of the pixels.

29. A display device comprising:
a display panel including a substrate; and
a touch sensing unit located on the substrate;
wherein the touch sensing unit includes:
   a plurality of first detection units extending in a first direction, and arranged in a second direction intersecting the first direction; and
   a plurality of second detection units extending in the second direction, and arranged in the first direction;
wherein each of the plurality of first detection units and the plurality of second detection units includes:
   a first pattern including a plurality of first lines;
   a first insulating layer located on the first pattern; and
   a second pattern located on the first insulating layer, and including a plurality of second lines overlapping the first lines in parallel with each other on a plane,
wherein the first pattern is between the substrate and the second pattern; and
wherein both side first boundary lines defining a width of each of the first lines are located inside both side second boundary lines defining a width of each of the second lines on the plane.

30. The display device of claim 29, wherein:
each of the first detection units includes:
   a plurality of first sensing electrodes arranged in the first direction; and
   a plurality of first connection electrodes connecting the first sensing electrodes which are adjacent to each other; and
each of the second detection units includes:
   a plurality of second sensing electrodes arranged in the second direction; and
   a plurality of second connection electrodes connecting the second sensing electrodes which are adjacent to each other.

31. The display device of claim 30, wherein each of the first sensing electrodes and the second sensing electrodes includes the first pattern and the second pattern.

32. The display device of claim 31, wherein any one of the first connection electrodes and the second connection electrodes intersecting the first connection electrodes on the plane includes the first pattern, and another one of the first connection electrodes and the second connection electrodes intersecting the first connection electrodes on the plane includes the second pattern.

33. The display device of claim 29, wherein:
the display device further comprises pad electrodes located on a pad portion of the substrate; and
the touch sensing unit includes a plurality of transmission lines comprising first ends connected to the first detection units and the second detection units, respectively, and second ends connected to the pad electrodes.

34. The display device of claim 33, wherein each of the transmission lines includes the first pattern and the second pattern.

35. The display device of claim 34, wherein the first pattern and second pattern of each of the transmission lines are connected via a plurality of contact holes defined in the first insulating layer.

* * * * *